(12) United States Patent
Chang et al.

(10) Patent No.: US 11,934,095 B2
(45) Date of Patent: Mar. 19, 2024

(54) METHOD OF MANAGING CRITICAL DIMENSION ERROR OF PHOTOMASK AND METHOD OF MANUFACTURING PHOTOMASK USING THE METHOD

(71) Applicant: SAMSUNG DISPLAY CO., LTD., Yongin-si (KR)

(72) Inventors: Jaehyuk Chang, Yongin-si (KR); Taejoon Kim, Yongin-si (KR); Hyunkyu Sun, Yongin-si (KR); Sikyung Lim, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 208 days.

(21) Appl. No.: 17/379,339

(22) Filed: Jul. 19, 2021

(65) Prior Publication Data
US 2022/0197133 A1 Jun. 23, 2022

(30) Foreign Application Priority Data
Dec. 22, 2020 (KR) .................. 10-2020-0181183

(51) Int. Cl.
*G03F 1/70* (2012.01)
(52) U.S. Cl.
CPC ..................... *G03F 1/70* (2013.01)
(58) Field of Classification Search
CPC ........................................... G03F 1/70
See application file for complete search history.

(56) References Cited

U.S. PATENT DOCUMENTS 8,498,469 B2 7/2013 Xiao et al.
9,880,474 B2 1/2018 Patra
(Continued)

FOREIGN PATENT DOCUMENTS

JP 2011197520 A 10/2011
JP 6502325 B2 3/2019
(Continued)

OTHER PUBLICATIONS

Mack, C. A. Fundamental Principles of Optical Lithography: The Science of Microfabrication (John Wiley & Sons, Ltd, 2007) (Year: 2007).*
(Continued)

*Primary Examiner* — Peter L Vajda
*Assistant Examiner* — Jayson D Cosgrove
(74) *Attorney, Agent, or Firm* — CANTOR COLBURN LLP

(57) ABSTRACT

A method of managing a critical dimension error includes (i) defining, in a photomask, N openings having a width, where N is a natural number, (ii) using graphs for each of the N openings, each of the graphs being obtained by setting locations through an opening of the N openings as a first axis and an intensity of transmitting light as a second axis, obtaining $ILS_i$ proportional to an inclination of a tangent to a graph of the graphs at a location corresponding to an edge of an opening and $I_i$ which is an intensity of transmitting light at the location, where i is a natural number from 1 to N, (iii) obtaining, with respect to each of the N openings, a real width $CD_i$ of the openings, and (iv) when $$I_{ave} = \frac{1}{N}\sum_{i=1}^{N} I_i,\ CD_{ave} = \frac{1}{N}\sum_{i=1}^{N} CD_i\ \text{and}\ ILS_{ave} = \frac{1}{N}\sum_{i=1}^{N} ILS_i,$$

obtaining $AIMEEF_i$ which is an aerial image mask error enhancement factor with respect to each of the N openings according to an equation below:

$$AIMEEF_i = -2\frac{I_i - I_{ave}}{(CD_i - CD_{ave})\cdot ILS_{ave} \cdot I_{ave}}.\quad\text{[Equation]}$$

10 Claims, 3 Drawing Sheets

(56) References Cited

U.S. PATENT DOCUMENTS

2007/0141480 A1* 6/2007 Okuno .................. G03F 1/70
430/394
2013/0283219 A1* 10/2013 Fujimura ............ G06F 30/20
716/53

FOREIGN PATENT DOCUMENTS

KR     20110001150 A     1/2011
KR     20190073276 A     6/2019

OTHER PUBLICATIONS

R.A. Budd et al., Development and application of a new tool for lithographic mask evaluation, the stepper equivalent Aerial Image Measurement System, AIMS, p. 119-129, 1997, vol. 41, No. 1/2.

* cited by examiner

METHOD OF MANAGING CRITICAL DIMENSION ERROR OF PHOTOMASK AND METHOD OF MANUFACTURING PHOTOMASK USING THE METHOD

This application claims priority to Korean Patent Application No. 10-2020-0181183, filed on Dec. 22, 2020, and all the benefits accruing therefrom under 35 U.S.C. § 119, the content of which in its entirety is herein incorporated by reference.

BACKGROUND

1. Field

One or more embodiments relate to a method of managing a critical dimension error of a photomask and a method of manufacturing a photomask using the same, and more particularly, to a method of managing a critical dimension error of a photomask, where the method may be efficiently used before the photomask is used in a photo-lithography process, and a method of manufacturing a photomask using the above method.

2. Description of the Related Art

A manufacture of an electronic device such as a display apparatus involves a process of forming a layer having a particular, preset pattern. A photo-lithography process is used to form the particular, preset pattern. A metal layer is formed, a photoresist layer is formed on the metal layer, and only preset portions of the photoresist layer are exposed using a photomask in which preset openings are defined, for example. Then the photoresist layer is developed such that the photoresist layer covers only preset portions of the metal layer, and the exposed portions of the metal layer are etched and the photoresist layer is removed to form a line which is a metal layer having a preset, particular pattern.

SUMMARY

It is desired to appropriately control an error in sizes of openings defined in a photomask used in a photoresist process, in a process of manufacturing the photomask. However, it is difficult to control the error.

One or more embodiments include a method of managing a critical dimension error of a photomask, where the method may be efficiently used before the photomask is used in a photo-lithography process, and a method of manufacturing a photomask using the above method. However, the above objective is an example, and the scope of the invention is not limited thereto.

Additional features will be set forth in part in the description which follows and, in part, will be apparent from the description, or may be learned by practice of the presented embodiments of the invention.

In an embodiment, a method of managing a critical dimension error, includes defining, in a photomask, N openings having a width corresponding to a target critical dimension, where N is a natural number, by irradiating light to the photomask, using graphs for each of the N openings, each of the graphs being obtained by setting locations in and outside an opening of the N openings as a first axis and an intensity of transmitting light as a second axis perpendicular to the first axis, obtaining $ILS_i$ that is proportional to an inclination of a tangent to a graph of the graphs at a location corresponding to an edge of an opening and $I_i$ which is an intensity of transmitting light at the location corresponding to the edge of the opening (i is a natural number from 1 to N), obtaining, with respect to each of the N openings, a real width $CD_i$ of the openings (i is a natural number from 1 to N), and $$I_{ave} = \frac{1}{N}\sum_{i=1}^{N} I_i, \; CD_{ave} = \frac{1}{N}\sum_{i=1}^{N} CD_i \text{ and } ILS_{ave} = \frac{1}{N}\sum_{i=1}^{N} ILS_i,$$

obtaining $AIMEEF_i$ which is an aerial image mask error enhancement factor with respect to each of the N openings according to an equation below:

$$AIMEEF_i = -2\frac{I_i - I_{ave}}{(CD_i - CD_{ave}) \cdot ILS_{ave} \cdot I_{ave}}. \quad \text{[Equation]}$$

(where i is a natural number from 1 to N).

In an embodiment, the method may further include obtaining $AIMEEF_{ave}$ which is an average of $AIMEEF_i$ with respect to the natural number i which is from 1 to N.

In an embodiment, as $AIMEEF_{ave}$ is greater, an allowable range of the critical dimension error may be further lowered.

In an embodiment, when a maximum value of an $AIMEEF_i$ with respect to the natural number i which is from 1 to N is $AIMEEF_{max}$, as $AIMEEF_{max}$ is greater, an allowable range of the critical dimension error may be further lowered.

In an embodiment, a method of managing a critical dimension error, includes defining, in a photomask, N openings having a width corresponding to a target critical dimension, where N is a natural number, by irradiating light to the photomask, obtaining an intensity $I_i$ of transmitting light at an edge of each of the N openings (i is a natural number from 1 to N), obtaining, a real width $CD_i$ of each of the N openings, while $$I_{ave} = \frac{1}{N}\sum_{i=1}^{N} I_i,$$

determining, from among $I_i$ with respect to the natural number i which is from 1 to N, an intensity that is equal to Iave or closest to $I_{ave}$ as $I_{quasi}$, while $$CD_{ave} = \frac{1}{N}\sum_{i=1}^{N} CD_i,$$

determining, from among $CD_i$ with respect to the natural number i which is from 1 to N, a real width that is equal to $CD_{ave}$ or closest to $CD_{ave}$, as $CD_{quasi}$, using a graph for an opening having the real width determined as $CD_{quasi}$ among the N openings, the graph being obtained by setting locations in and outside the opening as a first axis and an intensity of transmitting light as a second axis perpendicular to the first axis, obtaining $ILS_{quasi}$ that is proportional to an inclination of a tangent to the graph at a location corresponding to an edge of the opening, and obtaining $AIMEEF_i$ which is an aerial image mask error enhancement factor with respect to each of the N openings, according to an equation below:

$$AIMEEF_i = -2\frac{I_i - I_{quasi}}{(CD_i - CD_{quasi}) \cdot ILS_{quasi} \cdot I_{quasi}}, \quad \text{[Equation]}$$

(where i is a natural number from 1 to N).

In an embodiment, the method may further include obtaining $AIMEEF_{ave}$ which is an average of $AIMEEF_i$ with respect to a natural number i which is from 1 to N.

In an embodiment, as $AIMEEF_{ave}$ is greater, an allowable range of the critical dimension error may be further lowered.

In an embodiment, when a maximum value of $AIMEEF_i$ with respect to the natural number i which is from 1 to N is $AIMEEF_{max}$, as $AIMEEF_{max}$ is greater, an allowable range of the critical dimension error may be further lowered.

In an embodiment, a method of manufacturing a photomask includes determining the critical dimension error according to one of the methods described above, and forming a plurality of openings in the photomask within the critical dimension error which is determined.

In addition to the aforesaid details, other embodiments, features, and advantages will be clarified from the following drawings, claims, and detailed description.

BRIEF DESCRIPTION OF THE DRAWINGS

The above and other features, and advantages of certain embodiments of the invention will be more apparent from the following description taken in conjunction with the accompanying drawings, in which.

DETAILED DESCRIPTION

Figure 1:
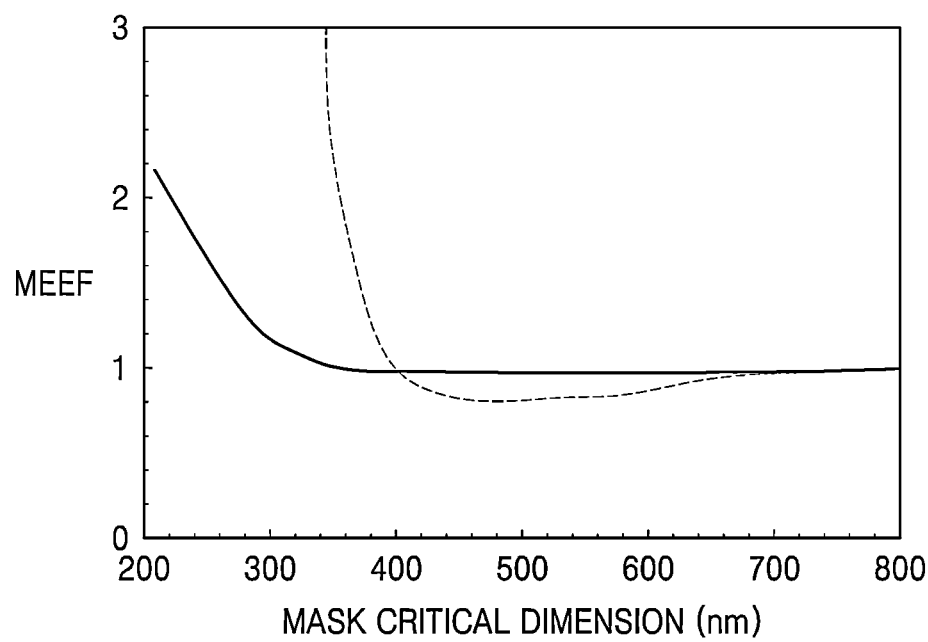
FIG. 1 is a graph showing a relationship between a critical dimension of a photomask and a photomask error enhancement factor.

Reference will now be made in detail to embodiments, examples of which are illustrated in the accompanying drawings, where like reference numerals refer to like elements throughout. In this regard, the embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, embodiments of the disclosure will be described in detail with reference to the accompanying drawings, and in the description with reference to the drawings, like reference numerals refer to like elements and redundant descriptions thereof will be omitted.

In the embodiments below, it will be understood that when various elements such as a layer, an area, or a plate is referred to as being "on" or "above" another element, it can be directly on or above the other element, or an intervening element may also be present. Also, in the drawings, for convenience of description, sizes of elements may be exaggerated or contracted. For example, since sizes and thicknesses of elements in the drawings are arbitrarily illustrated for convenience of explanation, the following embodiments are not limited thereto.

In the embodiments below, an x-axis, a y-axis, and a z-axis are not limited to three axes on a rectangular coordinates system but may be construed as including these axes. For example, an-x axis, a y-axis, and a z-axis may be at right angles or may also indicate different directions from one another, which are not at right angles.

About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

In an operation of forming a line of a preset pattern by patterning a metal layer by a photomask, there may be an error in a width of the line. The error may be caused by several factors, of which two may be as follows. One factor is an error in an opening of a photomask, through which light transmits through in an exposure process of a photoresist process. When an error is generated when forming an opening of a photomask during a manufacture of the photomask and thus a width of the opening differs from a preset width, an error is inevitably caused in a width of a line provided using the photomask. The other factor may be an error caused by, for example, diffraction of light in an exposure process despite using a photomask having an opening defined as preset with no error. Also, error may be generated in a width of a line to be provided, due to the limitation of a resolution of an exposure device.

FIG. 1 is a graph showing a relationship between a critical dimension of a photomask and a photomask error enhancement factor. A mask error enhancement factor ("MEEF") which is a photomask error enhancement factor may be defined as in Equation 1 below.

$$MEEF = \frac{\partial CD_{resist}}{\partial CD_{mask}} \quad \text{[Equation 1]}$$

That is, the photomask error enhancement factor is defined by a variation ($\partial CD_{resist}$) of a critical dimension in a photoresist per a variation ($\partial CD_{mask}$) of a critical dimension in a mask, and is a numerical expression of an influence by a variation ($\partial CD_{mask}$) in the critical dimension of the photomask, on a variation ($\partial CD_{resist}$) in a critical dimension of a photoresist provided in a display apparatus or the like. A critical dimension of a photomask refers to a minimum width of an opening defined in the photomask, and a critical dimension of a photoresist refers to a minimum width of an opening defined in the photoresist after performing exposure and development.

A solid line in FIG. 1 denotes a photomask error enhancement factor according to a variation in a width of a single opening defined in a photomask. A dashed line in FIG. 1 denotes a photomask error enhancement factor according to a variation in widths of multiple openings that are defined in a photomask at equal distances. As shown in the graph of FIG. 1, in a photomask for high resolution, that is, a photomask having narrow patterns, a photomask error enhancement factor thereof increases abruptly. This indicates that a critical dimension error in lines provided in a high-resolution display apparatus may abruptly increase due to minute critical dimension error in openings of a photomask during the manufacture of the high-resolution display apparatus. In an embodiment, when a photomask error enhancement factor is 3 and a critical dimension error in openings of a photomask is about 20 nanometers (nm), a critical dimension error of an opening of a photoresist generated in a display apparatus by the photomask, that is, a critical dimension error of a line generated by the photoresist amounts to about 60 nm. Thus, the critical dimension error needs to be precisely controlled in a photomask manufacturing process.

When manufacturing a low-resolution display apparatus or the like, the photomask error enhancement factor has a value close to about 1, as shown in FIG. 1. This indicates that an error generated in a critical dimension of an opening defined in a photoresist of a predetermined pattern mostly results from an error generated in a critical dimension of an opening (transmitting portion) defined in a photomask when manufacturing the photomask. Thus, when manufacturing a low-resolution display apparatus or the like, there is no need to consider a photomask error enhancement factor, and it is sufficient to manage just a critical dimension of an opening defined in a photomask.

In contrast, when manufacturing a high-resolution display apparatus or the like, as a photomask error enhancement factor increases abruptly as shown in FIG. 1, a critical dimension error of an opening of a photoresist provided in a display apparatus cannot be predicted just based on a critical dimension of an opening defined in a photomask without considering the photomask error enhancement factor. The problem here is that the photomask error enhancement factor is found only by measuring a critical dimension in a photoresist layer by performing exposure and development or the like on the photoresist layer by a relevant photomask. Thus, it is difficult to identify a photomask error enhancement factor in advance during a manufacturing process of a photomask.

To address this problem, an aerial image MEEF ("AIMEEF") defined as in Equation 2 below may be considered.

$$AIMEEF = -2 \frac{\partial I / \partial w}{\partial I / \partial x} = -2 \frac{\partial I / \partial w}{ILS_t \cdot I_t} \quad \text{[Equation 2]}$$

The numerator in Equation 2 may be calculated by measuring a critical dimension that is not uniform and a variation in an intensity of photomask-transmitting light according to the critical dimension from multiple measuring points of a photomask. The denominator in Equation 2 is defined by a value at a target opening defined with an accurately preset critical dimension, from among openings defined in the photomask. That is, $I_t$ denotes an intensity of transmitting light at an edge of a target opening defined with an accurately preset critical dimension without an error, and $ILS_t$ is also a value that may be obtained in connection with the target opening defined with the accurately preset critical dimension without an error. An image log slope ("ILS") will be described later.

In order to make use of Equation 2, however, the target opening defined with the accurately preset critical dimension needs to be determined from among the plurality of openings defined in the photomask. When there is no such target opening in the photomask, Equation 2 may not be used, and even when such a target opening is present, the target opening needs to be found.

To address this problem, using Equation 4, which is to be described later, may be considered.

Figure 2:
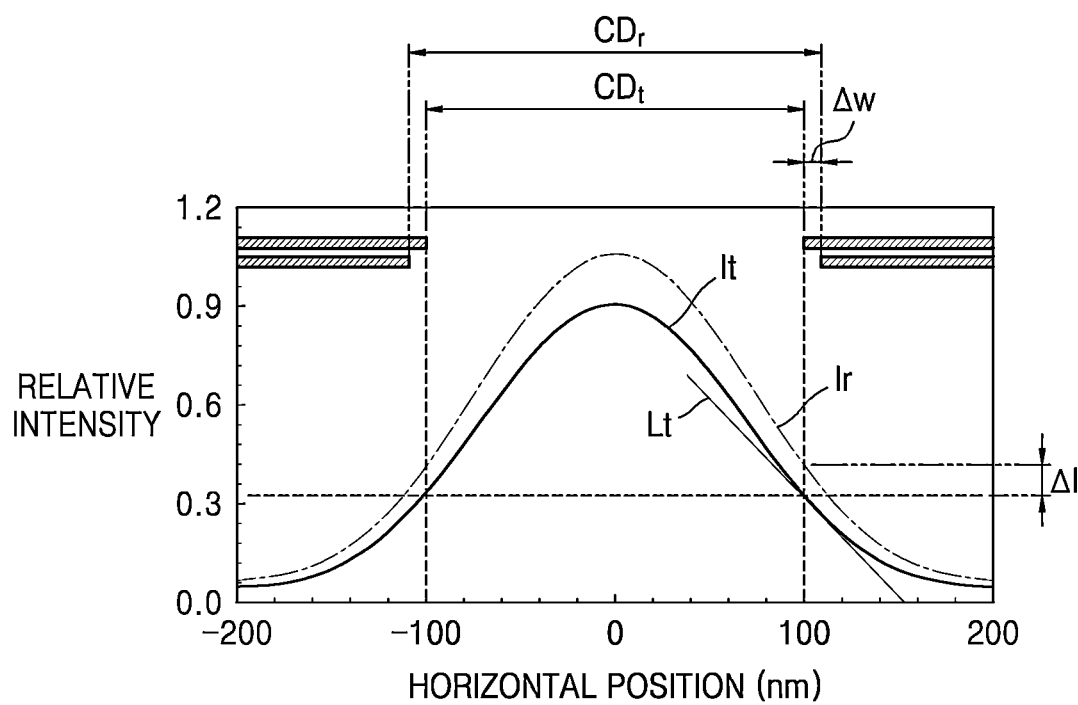
FIG. 2 is a graph showing a relative intensity distribution of transmitting light transmitting through an ideal target opening of a photomask and a relative intensity distribution of transmitting light transmitting through a real opening of the photomask.

Now, the ILS will be described first by referring to FIG. 2. FIG. 2 is a graph showing a relative intensity distribution of transmitting light transmitting through an ideal target opening of a photomask and a relative intensity distribution of transmitting light transmitting through a real opening of the photomask.

In FIG. 2, $CD_t$ denotes a critical dimension of a target opening defined with an accurately preset critical dimension from among openings of the photomask, and $CD_r$ denotes a critical dimension of a real opening defined with a critical dimension including an error from among the openings of the photomask, instead of an accurately preset critical dimension. A solid line in the graph of FIG. 2 denotes a relative intensity distribution of light transmitting through the target opening, according to locations in and outside the target opening. In detail, the solid line in the graph of FIG. 2 denotes a relative intensity distribution of light transmitting through the target opening, where the horizontal axis indicates locations in and outside the target opening and the vertical axis indicates a relative intensity of the light that has transmitted through the target opening. A broken line in the graph of FIG. 2 denotes a relative intensity distribution of light transmitting through the real opening, according to the locations in and outside the real opening. In detail, the broken line in the graph of FIG. 2 denotes a relative intensity distribution of light transmitting through the real opening, where the horizontal axis indicates locations in and outside the real opening and the vertical axis indicates a relative intensity of the light that has transmitted through the real opening.

As shown in the graph of FIG. 2, an intensity distribution of light that has transmitted through the real opening defined to have a width that is greater than the width of the target opening by an error of 2Δw has a shape that is spread further in a width direction of the opening than an intensity distribution of the light that has transmitted through the target opening. An intensity of transmitting light at a point corresponding to an edge of the target opening in the graph shown by the solid line in FIG. 2 may be also referred to as $I_t$. Also, in the graph of FIG. 2, a value obtained by dividing, by $I_t$, an inclination of a tangent Lt to the graph shown by the solid line at the point corresponding to the edge of the target opening is equal to $ILS_t$ in Equation 2 as described above. That is, $ILS_t$ is a value proportional to the inclination of the tangent Lt to the graph shown by the solid line in FIG. 2 at the point corresponding to the edge of the target opening. A difference between the intensity of transmitting light at the point corresponding to the edge of the target opening in the graph shown by the broken line and $I_t$ may be $\Delta I$. $\Delta I$ may be a variation in an intensity of transmitting light, caused by a critical dimension error of an opening of the photomask.

Figure 3:
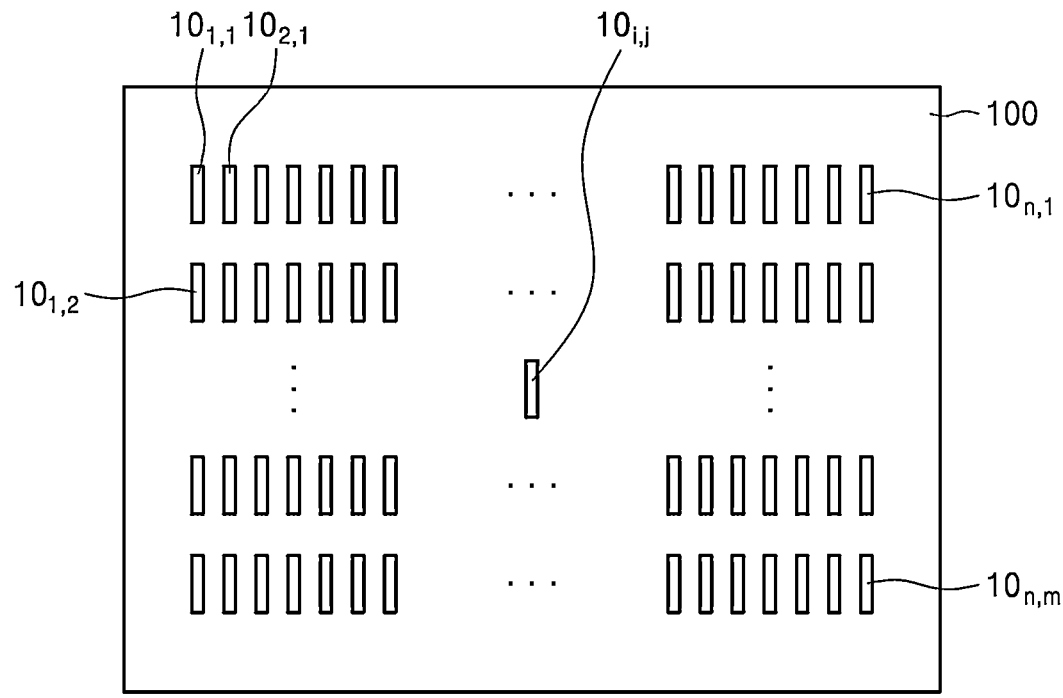
FIG. 3 is a plan view of a photomask for describing an embodiment of management of a photomask according to a method of managing a critical dimension error.

FIG. 3 is a plan view of a photomask for describing management of a photomask according to a method of managing a critical dimension error. According to the method of managing a critical dimension error in an embodiment, first, as illustrated in FIG. 3, N openings ($10_{1,1}$, $10_{2,1}$, ..., $10_{n,1}$, $10_{1,2}$, ... $10_{i,j}$, $10_{n,m}$) having a width corresponding to a target critical dimension are provided in a photomask 100. Here, n and m are natural numbers, at least one of n and m is greater than 1, and N is the product of n and m (i.e., N=n×m).

Even though the N openings are defined to have a width corresponding to the target critical dimension, an error may be generated in a width of each of the N openings during the defining the N openings. Accordingly, from among the N openings, there may be openings that have a width equal to the target critical dimension or there may be no openings that have a width equal to the target critical dimension.

Next, by irradiating light to the photomask 100, a graph as shown by the broken line in FIG. 2 is obtained with respect to each of the N openings. That is, with respect to each of the N openings, a graph where the horizontal axis denotes locations in and outside each opening and the vertical axis indicates an intensity of transmitting light transmitting through the opening is obtained.

Figure 4:
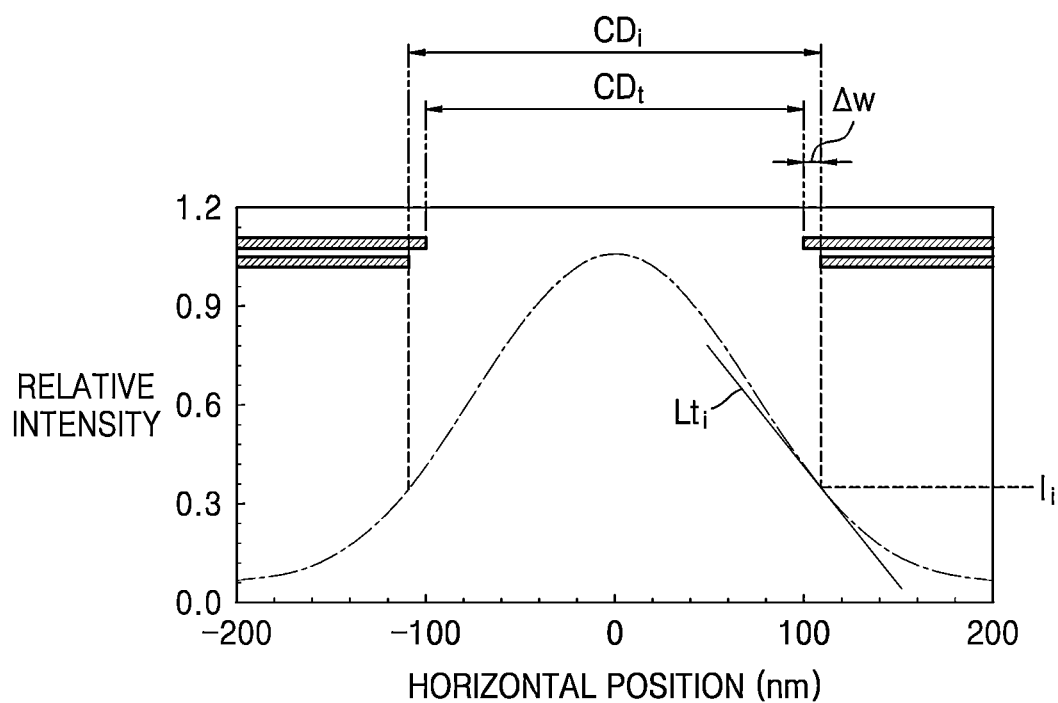
FIG. 4 is a graph showing an embodiment of management of a photomask according to a method of managing a critical dimension error.

FIG. 4 shows the above-described graph with respect to an $i^{th}$ opening. In FIG. 4, the $i^{th}$ opening is illustrated as having a critical dimension $CD_i$ that is greater than $CD_t$, which is a target critical dimension. From the graph as shown in FIG. 4, $ILS_i$ that is proportional to an inclination of a tangent $Lt_i$ to the graph at a location corresponding to an edge of an opening (which is not a target opening) and $I_i$ that is an intensity of transmitting light at the location corresponding to the edge of the opening (which is not a target opening) are obtained (i is a natural number from 1 to N). The above operation is performed on each of the N openings. Also, with respect to each of the N openings, a real width $CD_i$ of the openings is obtained (i is a natural number from 1 to N).

When applying Equation 2 described above to the $i^{th}$ opening, Equation 2 may be expressed as Equation 3 as below.

$$AIMEEF = -2\frac{\partial I/\partial w}{ILS_t \cdot I_t} = -2\frac{I_i - I_t}{(CD_i - CD_t) \cdot ILS_t \cdot I_t} \quad \text{[Equation 3]}$$

However, in order to make use of Equation 3, the target opening defined with an accurately preset critical dimension still needs to be determined from among the plurality of openings defined in the photomask. When there is no such target opening in the photomask, Equation 3 may not be used, and even when such a target opening is present, the target opening needs to be found.

Thus, according to the method of managing a critical dimension error in the illustrated embodiment, when $$I_{ave} = \frac{1}{N}\sum_{i=1}^{N} I_i, \; CD_{ave} = \frac{1}{N}\sum_{i=1}^{N} CD_i, \text{ and } ILS_{ave} = \frac{1}{N}\sum_{i=1}^{N} ILS_i,$$

$AIMEEF_i$ which is an AIMEEF for each of the N openings is obtained according to Equation 4 below (i is a natural number from 1 to N).

$$AIMEEF_i = -2\frac{I_i - I_{ave}}{(CD_i - CD_{ave}) \cdot ILS_{ave} \cdot I_{ave}} \quad \text{[Equation 4]}$$

That is, in Equation 4, compared to Equation 3, $I_{ave}$ is used instead of $I_t$, $CD_{ave}$ is used instead of $CD_t$, and $ILS_{ave}$ is used instead of $ILS_t$. When forming N openings having a critical dimension of $CD_t$, even though an error occurs in the critical dimension, because the error occurs evenly, an average value of values measured from each opening may be regarded as corresponding to a value measured from a target opening. According to the method of managing a critical dimension error in the illustrated embodiment, even when there is no target opening, or even when there is a target opening but it is not known which one is the target opening, $AIMEEF_i$ which is an AIMEEF with respect to each of the N openings may be obtained.

Next, $AIMEEF_{ave}$ which is an average of $AIMEEF_i$ with respect to the natural number i, where i is from 1 to N, may be performed. In this case, as $AIMEEF_{ave}$ is greater, an allowable range of a critical dimension error, to be applied in a manufacturing process of a photomask, may be further lowered. As described above with reference to FIG. 1, as the MEEF is greater, a greater error is caused in a photoresist by an error generated in a photomask, and thus, there is a need to further reduce a critical dimension error of openings defined in a photomask that has greater $AIMEEF_{ave}$.

According to a method of managing a critical dimension error in an embodiment, an operation of calculating $AIMEEF_{ave}$ may be omitted, and when a maximum value of an $AIMEEF_i$ with respect to the natural number i, which is from 1 to N, is $AIMEEF_{max}$, as $AIMEEF_{max}$ is greater, the allowable range of the critical dimension error may be further lowered. When an opening of a photoresist that is defined by one of the N openings in the photomask has a relatively large error than other openings of the photoresist that are defined by others of the N openings in the photomask, a defect is caused in a line provided using the photoresist. An opening among the N openings of the photomask via which a largest error is caused may be an opening corresponding to $AIMEEF_{max}$ which is the maximum value from among $AIMEEF_i$. Thus, as $AIMEEF_{max}$ is greater, it may be considered to further lower an allowable range of a critical dimension error.

Hereinafter, a method of managing a critical dimension error, in another embodiment, will be described. According to the method of managing a critical dimension error, in the illustrated embodiment, first, as illustrated in FIG. 3, N openings ($10_{1,1}$, $10_{2,1}$, ..., $10_{n,1}$, $10_{1,2}$, ... $10_{i,j}$, $10_{n,m}$) having a width corresponding to a target critical dimension are defined in the photomask 100. Here, n and m are natural numbers, and at least one of n and m is greater than 1, and N is the product of n and m (i.e., N=n×m).

Even though the N openings are defined to have a width corresponding to the target critical dimension, an error may be generated in a width of each of the N openings during the defining the N openings. Accordingly, from among the N openings, there may be openings that have a width equal to the target critical dimension or there may be no openings that have a width equal to the target critical dimension.

Next, by irradiating light to the photomask 100, an intensity $I_i$ of transmitting light at the edge of each of the N openings is obtained (i is a natural number from 1 to N) with respect to each of the N openings. Also, a real width $CD_i$ of each of the N openings is obtained (i is a natural number from 1 to N).

Next, while $$I_{ave} = \frac{1}{N}\sum_{i=1}^{N} I_i,$$

an intensity that is equal to $I_{ave}$ or closest to $I_{ave}$ with respect to a natural number i which is from 1 to N is determined as $I_{quasi}$. This is to use $I_{quasi}$ instead of $I_t$ of Equation 3. A value that is equal to $I_{ave}$ or closest to $I_{ave}$ from among $I_i$ is related to an actually existing opening, and thus, that value may be regarded as corresponding to the realistic $I_t$.

Similarly, while $$CD_{ave} = \frac{1}{N}\sum_{i=1}^{N} CD_i,$$

a critical dimension that is equal to $CD_{ave}$ or closest to $CD_{ave}$ with respect to a natural number i which is from 1 to N is determined as $CD_{quasi}$. This is to use $CD_{quasi}$ instead of $CD_t$ of Equation 3. A value that is equal to $CD_{ave}$ or closest to $CD_{ave}$ from among $CD_i$ is related to an actually existing opening, and thus, the value may be regarded as corresponding to the realistic $CD_t$.

Figure 5:
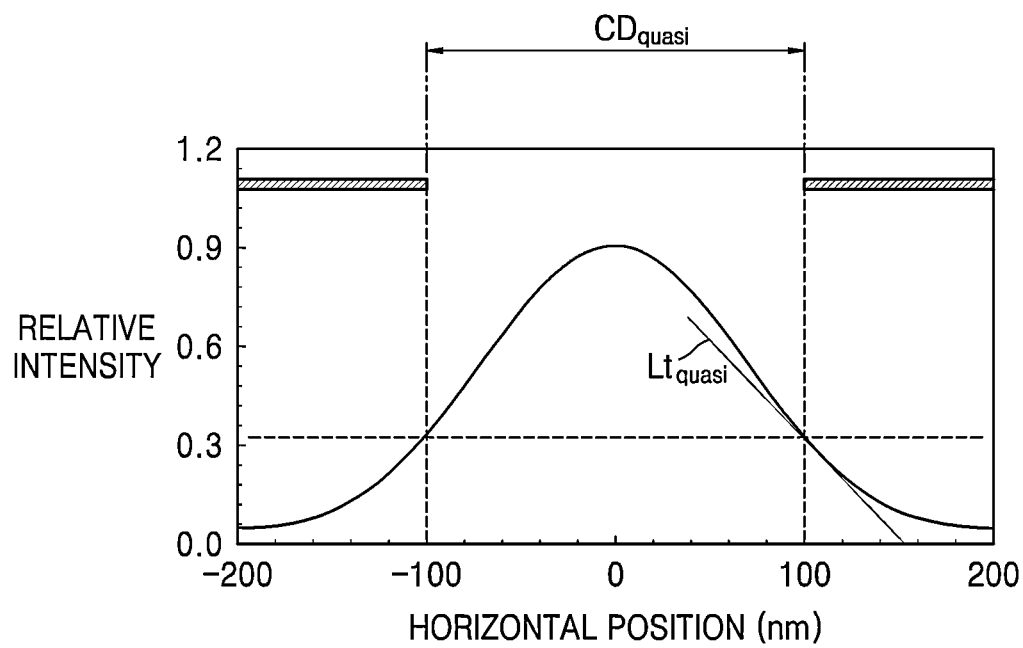
FIG. 5 is a graph showing an embodiment of management of a photomask according to a method of managing a critical dimension error.

In an opening corresponding to that determined as $CD_{quasi}$, from among $CD_i$ with respect to a natural number i from 1 to N, a graph is obtained by setting locations in and outside the opening as the horizontal axis and an intensity of transmitting light as the vertical axis. The graph may be shown, for example, as in FIG. 5. From the graph as shown in FIG. 5, $ILS_{quasi}$ that is proportional to an inclination of a tangent $Lt_{quasi}$ to the graph at a location corresponding to an edge of an opening (which is not a target opening) is obtained.

In order to make use of Equation 3 as described above, a target opening defined with an accurately preset critical dimension still needs to be determined from among a plurality of openings defined in a photomask. When there is no such target opening in the photomask, Equation 3 may not be used, and even when such a target opening is present, the target opening needs to be found.

Thus, according to the method of managing a critical dimension error of the illustrated embodiment, $AIMEEF_i$ which is an AIMEEF with respect to each of the N openings is obtained according to Equation 5 below (i is a natural number from 1 to N).

$$AIMEEF_i = -2\frac{I_i - I_{quasi}}{(CD_i - CD_{quasi}) \cdot ILS_{quasi} \cdot I_{quasi}} \quad [\text{Equation 5}]$$

That is, in Equation 5, compared to Equation 3, $I_{quasi}$ is used instead of $I_t$, $CD_{quasi}$ is used instead of $CD_t$, and $ILS_{quasi}$ is used instead of $ILS_t$.

According to the method of managing a critical dimension error, in the illustrated embodiment, even when there is no target opening, or even when there is a target opening but it is not known which one is the target opening, $AIMEEF_i$ which is an AIMEEF with respect to each of the N openings may be obtained.

Next, $AIMEEF_{ave}$ which is an average of $AIMEEF_i$ with respect to the natural number i, which is from 1 to N, may be performed. In this case, as $AIMEEF_{ave}$ is greater, an allowable range of a critical dimension error, to be applied in a manufacturing process of a photomask, may be further lowered. As described above with reference to FIG. 1, as MEEF is greater, a greater error is caused in a photoresist by an error generated in a photomask, and thus, there is a need to further reduce a critical dimension error of openings defined in a photomask that has greater $AIMEEF_{ave}$.

According to a method of managing a critical dimension error, in another embodiment, an operation of calculating $AIMEEF_{ave}$ may be omitted, and when a maximum value of $AIMEEF_i$ with respect to the natural number i which is from 1 to N, is $AIMEEF_{max}$, as $AIMEEF_{max}$ is greater, the allowable range of the critical dimension error may be further lowered. When an opening of a photoresist that is defined by one of the N openings in the photomask has a relatively large error than other openings of the photoresist that are defined by others of the N openings in the photomask, a defect is caused in a line provided using the photoresist. An opening among the N openings of the photomask via which a largest error is caused may be an opening corresponding to $AIMEEF_{max}$ which is the maximum value from among $AIMEEF_i$. Thus, as $AIMEEF_{max}$ is greater, it may be considered to further lower an allowable range of a critical dimension error.

In Table 1 below, a first column other than the leftmost stub column including stub entries (i.e., $CD_t$, Average, 3σ) represents an average (Average) of critical dimensions of sixteen openings that are intended to have a target critical dimension ($CD_t$) of about 1100 nm and a triple value (3σ) of a standard deviation of the critical dimensions, a second column represents an average (Average) of critical dimensions of sixteen openings that are intended to have a target critical dimension ($CD_t$) of about 1200 nm and a triple value (3σ) of a standard deviation of the critical dimensions, a third column represents an average (Average) of critical dimensions of sixteen openings that are intended to have a target critical dimension ($CD_t$) of about 1400 nm and a triple value (3σ) of a standard deviation of the critical dimensions, a fourth column represents an average (Average) of critical dimensions of sixteen openings that are intended to have a target critical dimension ($CD_t$) of about 1600 nm and a triple value (3σ) of a standard deviation of the critical dimensions, a fifth column represents an average (Average) of critical dimensions of sixteen openings that are intended to have a target critical dimension ($CD_t$) of about 1800 nm and a triple value (3σ) of a standard deviation of the critical dimensions, a sixth column represents an average (Average) of critical dimensions of sixteen openings that are intended to have a target critical dimension ($CD_t$) of about 2000 nm and a triple value (3σ) of a standard deviation of the critical dimensions, a seventh column represents an average (Average) of critical dimensions of sixteen openings that are intended to have a target critical dimension ($CD_t$) of about 2500 nm and a triple value (3σ) of a standard deviation of the critical dimensions, and an eighth column represents an average (Average) of critical dimensions of sixteen openings that are intended to have a target critical dimension ($CD_t$) of about 3000 nm and a triple value (3σ) of a standard deviation of the critical dimensions (in units of nm).

TABLE 1

| CDt | 1100 | 1200 | 1400 | 1600 | 1800 | 2000 | 2500 | 3000 |
|---|---|---|---|---|---|---|---|---|
| Average | 1092.4 | 1209.9 | 1425.4 | 1583.8 | 1801.5 | 2030.9 | 2504.4 | 2980.6 |
| 3σ | 255.4 | 242.5 | 235.0 | 272.4 | 226.4 | 229.4 | 279.7 | 271.9 |

Figure 6:
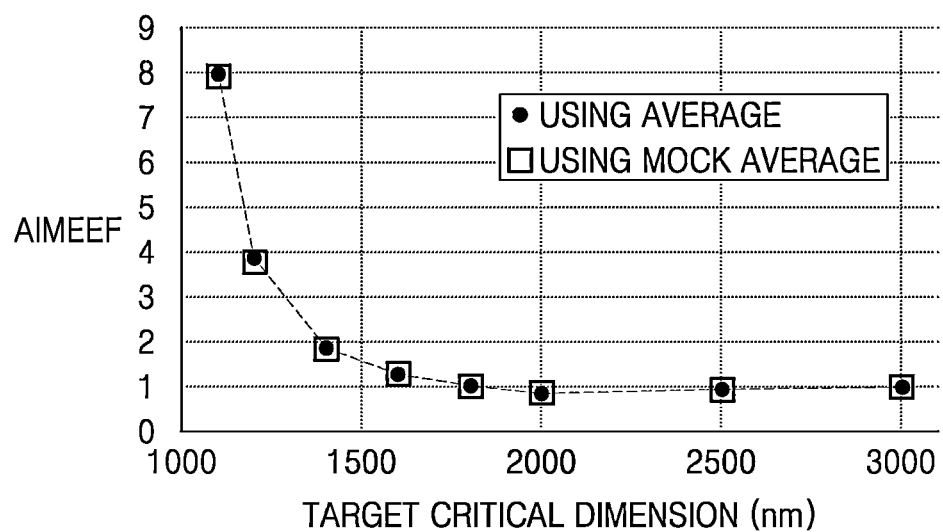
FIG. 6 is a graph showing a result of the method of managing a critical dimension error, in the embodiments of FIGS. 4 and 5.

FIG. 6 is a graph in which $AIMEEF_{ave}$ is expressed as points when using an average, that is, when using Equation 4, with respect to the photomasks as listed in Table 1, and $AIMEEF_{ave}$ is expressed as quadrangles when using a mock average, that is, when using Equation 5, with respect to the photomasks as listed in Table 1. As shown in FIG. 6, a result of using Equation 4 is substantially identical to a result of using Equation 5. In addition, these results did not greatly differ from an average value of sixteen values calculated using Equation 3 which is the definition of AIMEEF. Table 2 below shows $AIMEEF_{ave}$ corresponding to a case of using an average, $AIMEEF_{ave}$ corresponding to a case of using a mock average, and an average of N values, calculated using Equation 3 which is the definition of AIMEEF.

TABLE 2

| CDt | 1100 | 1200 | 1400 | 1600 | 1800 | 2000 | 2500 | 3000 |
|---|---|---|---|---|---|---|---|---|
| When using average | 7.96537 | 3.89223 | 1.86766 | 1.28570 | 1.02414 | 0.87100 | 0.94591 | 1.00585 |
| When using mock average | 7.91723 | 3.77467 | 1.84184 | 1.29311 | 1.02299 | 0.87470 | 0.93354 | 1.00698 |
| When using Equation 3 | 7.98758 | 3.78195 | 1.86113 | 1.28473 | 1.02499 | 0.88949 | 0.93329 | 1.00641 |

The invention is not limited to the method of managing a critical dimension error described above. In an embodiment, a manufacturing method of a photomask including determining a critical dimension error according to one of the embodiments described above, and defining a plurality of openings in the photomask within the determined critical dimension error is also included in the scope of the invention. Forming a plurality of openings in a photomask within the critical dimension error indicates adjusting a width of the plurality of openings defined in the photomask to be within the critical dimension error by adjusting, for example, a resolution condition of an exposure device used in a photomask manufacturing process, an exposure condition of a photoresist, and/or a developing condition of the photoresist.

In an embodiment as described above, a method of managing a critical dimension error, where the method may be efficiently applicable before the photomask is used in a photo-lithography process and a method of manufacturing a photomask, by the above method, may be provided. However, the scope of the invention is not limited by the above-described effects.

It should be understood that embodiments described herein should be considered in a descriptive sense only and not for purposes of limitation. Descriptions of features or advantages within each embodiment should typically be considered as available for other similar features or advantages in other embodiments. While one or more embodiments have been described with reference to the drawing figures, it will be understood by those of ordinary skill in the art that various changes in form and details may be made therein without departing from the spirit and scope of the invention.

What is claimed is:

1. A method of managing a critical dimension error, the method comprising:
defining, in a photomask, N openings having a width corresponding to a target critical dimension, where N is a natural number;
by irradiating light to the photomask, using graphs for each of the N openings, each of the graphs being obtained by setting locations in and outside an opening of the N openings as a first axis and an intensity of transmitting light as a second axis perpendicular to the first axis, obtaining $ILS_i$ which is proportional to an inclination of a tangent to a graph of the graphs at a location corresponding to an edge of an opening and $I_i$ which is an intensity of transmitting light at the location corresponding to the edge of the opening, where i is a natural number from 1 to N;
obtaining, with respect to each of the N openings, a real width $CD_i$ of the openings; and
when $$I_{ave} = \frac{1}{N}\sum_{i=1}^{N} I_i, \; CD_{ave} = \frac{1}{N}\sum_{i=1}^{N} CD_i, \text{ and } ILS_{ave} = \frac{1}{N}\sum_{i=1}^{N} ILS_i,$$

obtaining $AIMEEF_i$ which is an aerial image mask error enhancement factor with respect to each of the N openings according to an equation below:

$$AIMEEF_i = -2\frac{I_i - I_{ave}}{(CD_i - CD_{ave}) \cdot ILS_{ave} \cdot I_{ave}}. \quad \text{[Equation]}$$

2. The method of claim 1, further comprising obtaining $AIMEEF_{ave}$ which is an average of $AIMEEF_i$ with respect to the natural number i which is from 1 to N.

3. The method of claim 2, wherein, as $AIMEEF_{ave}$ is greater, an allowable range of the critical dimension error is further lowered.

4. The method of claim 1, wherein, when a maximum value of an $AIMEEF_i$ with respect to the natural number i which is from 1 to N is $AIMEEF_{max}$, as $AIMEEF_{max}$ is greater, an allowable range of the critical dimension error is further lowered.

5. A method of managing a critical dimension error, the method comprising:
- defining, in a photomask, N openings having a width corresponding to a target critical dimension, where N is a natural number;
- by irradiating light to the photomask, obtaining an intensity $I_i$ of transmitting light at an edge of each of the N openings, where i is a natural number from 1 to N;
- obtaining, a real width $CD_i$ of each of the N openings; while $$I_{ave} = \frac{1}{N}\sum_{i=1}^{N} I_i,$$

determining, from among $I_i$ with respect to the natural number i which is from 1 to N, an intensity which is equal to $I_{ave}$ or closest to $I_{ave}$ as $I_{quasi}$;
while $$CD_{ave} = \frac{1}{N}\sum_{i=1}^{N} CD_i,$$

determining, from among $CD_i$ with respect to the natural number i which is from 1 to N, a real width which is equal to $CD_{ave}$ or closest to $CD_{ave}$, as $CD_{quasi}$;
- using a graph for an opening having the real width determined as $CD_{quasi}$ among the N openings, the graph being obtained by setting locations in and outside the opening as a first axis and an intensity of transmitting light as a second axis perpendicular to the first axis, obtaining $ILS_{quasi}$ which is proportional to an inclination of a tangent to the graph at a location corresponding to an edge of the opening; and
- obtaining $AIMEEF_i$ which is an aerial image mask error enhancement factor with respect to each of the N openings, according to an equation below:

$$AIMEEF_i = -2\frac{I_i - I_{quasi}}{(CD_i - CD_{quasi}) \cdot ILS_{quasi} \cdot I_{quasi}}.$$ [Equation]

6. The method of claim 5, further comprising obtaining $AIMEEF_{ave}$ which is an average of $AIMEEF_i$ with respect to the natural number i which is from 1 to N.

7. The method of claim 6, wherein, $AIMEEF_{ave}$ is greater, an allowable range of the critical dimension error is further lowered.

8. The method of claim 5, wherein, when a maximum value of $AIMEEF_i$ with respect to the natural number i which is from 1 to N is $AIMEEF_{max}$, as $AIMEEF_{max}$ is greater, an allowable range of the critical dimension error is further lowered.

9. A method of manufacturing a photomask, the method comprising:
- determining the critical dimension error according to the method of claim 1; and
- defining a plurality of openings in the photomask within the determined critical dimension error.

10. A method of manufacturing a photomask, the method comprising:
- determining the critical dimension error according to the method of claim 5; and
- defining a plurality of openings in the photomask within the determined critical dimension error.

* * * * *